(12) United States Patent
Jung

(10) Patent No.: US 6,316,338 B1
(45) Date of Patent: Nov. 13, 2001

(54) LASER ANNEALING METHOD

(75) Inventor: Yun-Ho Jung, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/605,409

(22) Filed: Jun. 28, 2000

(30) Foreign Application Priority Data

Jun. 28, 1999 (KR) .................................................. 99-24742

(51) Int. Cl.[7] .............................. H01L 21/20; H01L 21/36
(52) U.S. Cl. ........................................... 438/487; 438/463
(58) Field of Search .................................... 438/149, 150, 438/308, 378, 486, 488, 463, 487, 662, 712, 795, 798, 489

(56) References Cited

U.S. PATENT DOCUMENTS

| | | | |
|---|---|---|---|
| 5,591,668 | * | 1/1997 | Maegawa et al. .................. 438/463 |
| 5,815,494 | * | 9/1998 | Yamazaki et al. ...................... 372/25 |
| 6,072,194 | * | 6/2000 | Wakita et al. .......................... 257/66 |
| 6,117,752 | * | 9/2000 | Suzuki ................................. 438/487 |

\* cited by examiner

*Primary Examiner*—David Nelms
*Assistant Examiner*—David Nhu
(74) *Attorney, Agent, or Firm*—Long Aldridge & Norman, LLP

(57) ABSTRACT

A laser annealing method for crystallizing a silicon film includes preparing a laser beam having a width smaller than a predetermined width that is two times longer than a silicon grain grown by a single shot of the laser beam in which energy of the laser beam is determined to melt down a silicon film completely, carrying out a first laser beam irradiation on the silicon film with the laser beam to grow silicon grains, displacing the laser beam on the silicon film by an overlap ratio under ½ of the width of the laser beam, and carrying out a second laser beam irradiation on the silicon film with the laser beam to grow the silicon grains again.

24 Claims, 10 Drawing Sheets first irradiated region

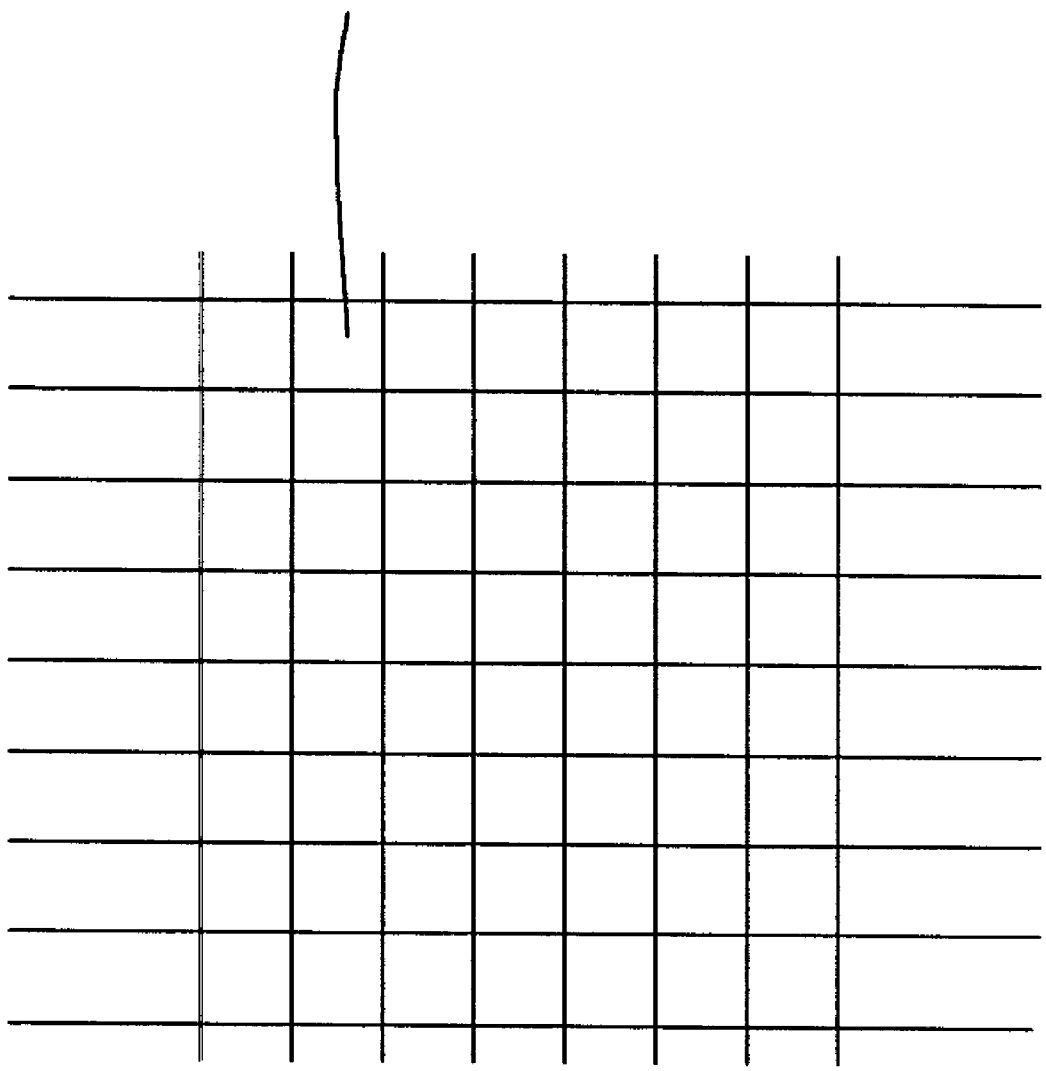

first irradiated region

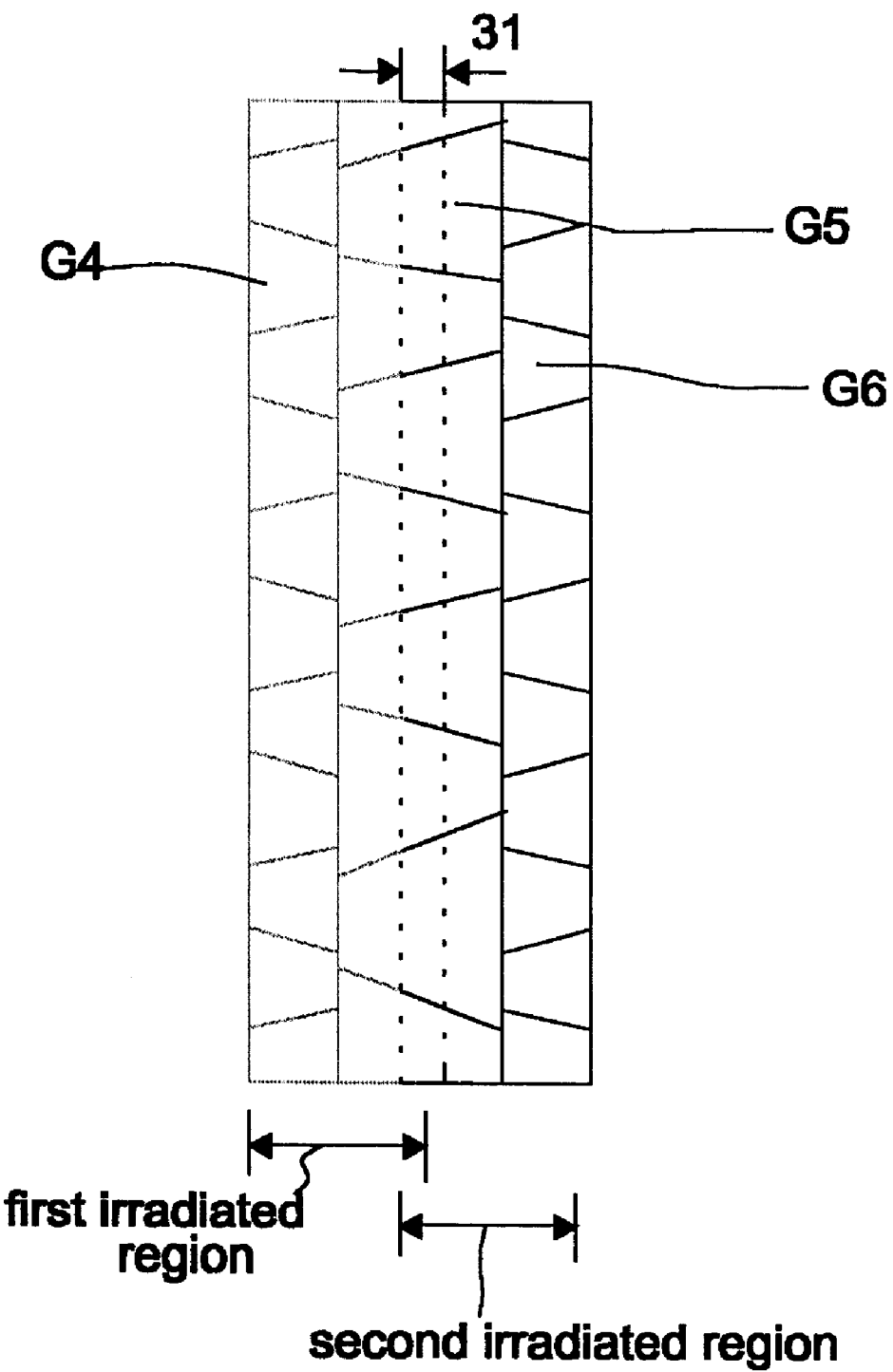

(41)  (42)

A>B

LASER ANNEALING METHOD

This application claims the benefit of Korean patent application number 1999-24742, filed Jun. 28, 1999, which is hereby incorporated by reference for all purposes as fully set forth herein.

BACKGROUND OF THE INVENTION

1. Field of the Invention

The present invention relates to a laser annealing method, more particularly, to a laser annealing method for crystallizing a silicon film.

2. Discussion of the Related Art

Laser annealing is used for activating an amorphous part of a silicon film pattern by impurity doping or crystallizing a silicon film. Generally, silicon film crystallization by laser is carried out by supplying a film with laser energy by scanning a silicon film with a laser beam having a predetermined profile by overlapping.

FIG. 1 shows a graph of laser energy density vs. size of crystal particle when an amorphous silicon film is irradiated with an excimer laser by a single shot.

Referring to FIG. 1, in region I where energy is under a predetermined value, the size of laser particle increase gradually even though the laser energy density increases. In region II where energy density is over the predetermined value, crystal particle size increases abruptly. In region III where energy density is larger than that of region II, the crystal particle size is reduced abruptly. In particular, after the amorphous silicon film has been melted down, the crystal particle size is changed greatly in accordance with laser energy density.

The respective regions are explained in more detail in the following description.

In region I, an upper part of the amorphous silicon film is melted partially due to low laser energy density. In this case, crystal particles start to grow as the melted upper silicon proceeds to be solidified from the fine crystallite seeds in the lower amorphous silicon film. Since the crystal particles grow vertically, the crystal particle size changes less and is small with respect to energy density variation.

In region II, melting continues to an interface and unmelted silicon particles exist in a portion of the interface. In this case, the crystal particle size increases greatly since the crystal particles grow laterally to the direction of the melted silicon by using the remaining silicon crystal particles which have not yet been melted as seeds. As the density of the seeds becomes smaller, the crystal particle size becomes larger. In this case, the crystal particle size may increase 10 times larger than that in region I. However, as can be seen in the drawing, the variation of the crystal particle size in this region fluctuates greatly in accordance with the laser energy density. Namely, a process window is very small since there is a high variation of the crystal particle size with respect to a minute variation of the energy density. Accordingly, when laser crystallization is carried out within region II, the maintenance of process equipments is very difficult due to a narrow process window. Moreover, this causes low yield which makes it disadvantageous for mass production.

In region III, there is no remaining crystal particle in the interface since the amorphous silicon film including the interface is completely melted down. In this case, during the solidification of the melted silicon, nuclei are generated to grow frequently and simultaneously, thereby forming fine grains.

FIGS. 2A to 2C show schematic layouts of silicon crystallization by laser beam irradiation to explain laser annealing according to a related art. Here, a simplified figure of silicon is shown in the drawing. The figure or shape of a laser beam for laser annealing is patterned by an optical system, thereby preparing a line type figure. In this case, the laser beam is patterned to have a width between about 0.1~2 mm and a length between about 10~1000 mm and its energy density has a range sufficient to melt an amorphous silicon film.

Referring to FIG. 2A, a first irradiation is carried out on a silicon film with a laser beam adjusted to have the above-mentioned conditions by an optical system. A portion of the first irradiated amorphous silicon is melted to an interface. Yet, unmelted silicon particles still exist at the interface. Crystallization takes place in the direction of the melted silicon since the particles working as seeds for crystallization grow laterally. As a result, a polycrystalline silicon region consisting of a plurality of silicon grains is produced.

Referring to FIG. 2B, having been displaced to a predetermined distance, the silicon film undergoes a second irradiation with the laser beam. The displacement of the substrate is related to the overlap degree of the laser beam. Thus, as the displacement of the substrate becomes longer, the degree of overlap becomes smaller. Generally, in order to grow a silicon grain up to 4000~5000 Å, the silicon film has to be irradiated with a laser beam 10 to 20 times repeatedly to provide sufficient laser energy with the irradiations being carried out overlapping one another. In general, the overlap degree of the laser beam lies between about 80~99%. A plurality of silicon grains 10 to 10,000 Å long exists in the silicon film crystallized by a single shot of a laser beam. Small silicon grains are recrystallized to grow provided that the same spot of such polycrystalline silicon firm undergoes laser beam irradiations more than several times. This results in the formation of uniformly large silicon grains at a certain time. Therefore, a specific portion of a silicon film needs to be irradiated with laser beams several times to form large silicon grains uniformly in the overall film during the silicon film crystallization.

In FIG. 2B, 21 designates a displacement and a direction of relative movement of a laser beam against the silicon film is shown by arrows. A portion of the second irradiated amorphous silicon is melted down again to grow and be crystallized. In this case, silicon grains in the portion irradiated with the laser beam repeatedly become larger. G1 denotes the silicon grains irradiated by the laser beam once, while G2 designates other silicon grains irradiated by the laser beams twice. The entire amorphous silicon film is irradiated with the laser beams repeatedly for crystallization by scanning the entire surface of the substrate.

Referring to FIG. 2C, a polycrystalline silicon film consisting of silicon grains G3 grown to 4000~5000 Å is produced. In accordance with the above description, the silicon grains G3 shown in FIG. 2C are formed by being supplied with laser energy repeatedly 10 to 20 times.

However, the related art has several problems. The related art requires increased process time due to many repeated irradiations of laser beams on a silicon film of a predetermined area needing a high degree of overlap of the laser beams. Also, the laser annealing process is carried out in a vacuum to reduce surface roughness due to high grain boundaries resulting from multiple laser beam irradiations. Thus, the related art requires a special annealing apparatus to meet the need for a vacuum atmosphere. The related art uses a small energy region with a small process window which makes it difficult to construct a proper optical system. Moreover, such problems lead to reduced productivity and low product yield.

SUMMARY OF THE INVENTION

Accordingly, the present invention is directed to a laser annealing method that substantially obviates one or more of the problems due to limitations and disadvantages of the related art.

An object of the present invention is to provide a laser annealing method for forming a polycrystalline film with large silicon grains by having a substrate irradiated with a laser beam having energy sufficient to melt down amorphous silicon completely.

Another object of the present invention is to provide a laser annealing method with an increase in the process speed by scanning an entire surface of the substrate with the laser beam where the degree of overlap is under half of the beam width.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes preparing a laser beam having a width smaller than a predetermined width which is two times longer than a silicon grain grown by a single shot of the laser beam wherein energy of the laser beam is determined for melting down a silicon film completely, carrying out a first laser beam irradiation on the silicon film with the laser beam to grow silicon grains, displacing the laser beam on the silicon film by an overlap ratio under ½ of the width of the laser beam, and carrying out a second laser beam irradiation on the silicon film with the laser beam to grow the silicon grains again.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the inventing and together with the description serve to explain the principle of the invention. In the drawings:

FIGS. 2A to 2C show schematic layouts of silicon crystallization by laser beam irradiation in accordance with the number of laser beam irradiations in the related art;

FIGS. 3A to 3C show schematic layouts of silicon crystallization by laser annealing in accordance with the number of laser beam irradiations according to a first embodiment of the present invention;

DETAILED DESCRIPTION OF PREFERRED EMBODIMENTS

Reference will now be made in detail to the preferred embodiments of the present invention, examples of which are illustrated in the accompanying drawings.

The shape of a laser beam for laser annealing is patterned by an optical system. In the preferred embodiment, a laser beam having a line type shape is preferred for the present invention. In this case, the laser beam is patterned to have a width of about several micrometers wide (say 1 to 10 micrometers as shown in FIG. 3A) and a length of about 10~1000 mm as shown in FIG. 3A, which is smaller in width than the related art range of 0.1~2 mm.

When a silicon substrate is irradiated with a laser beam having a large width, the part of the silicon substrate exposed to the laser beam is completely melted and then crystallized. Grains proceed to grow from both sides of the interfaces toward the center of the melted region of the silicon.

Figure 1:
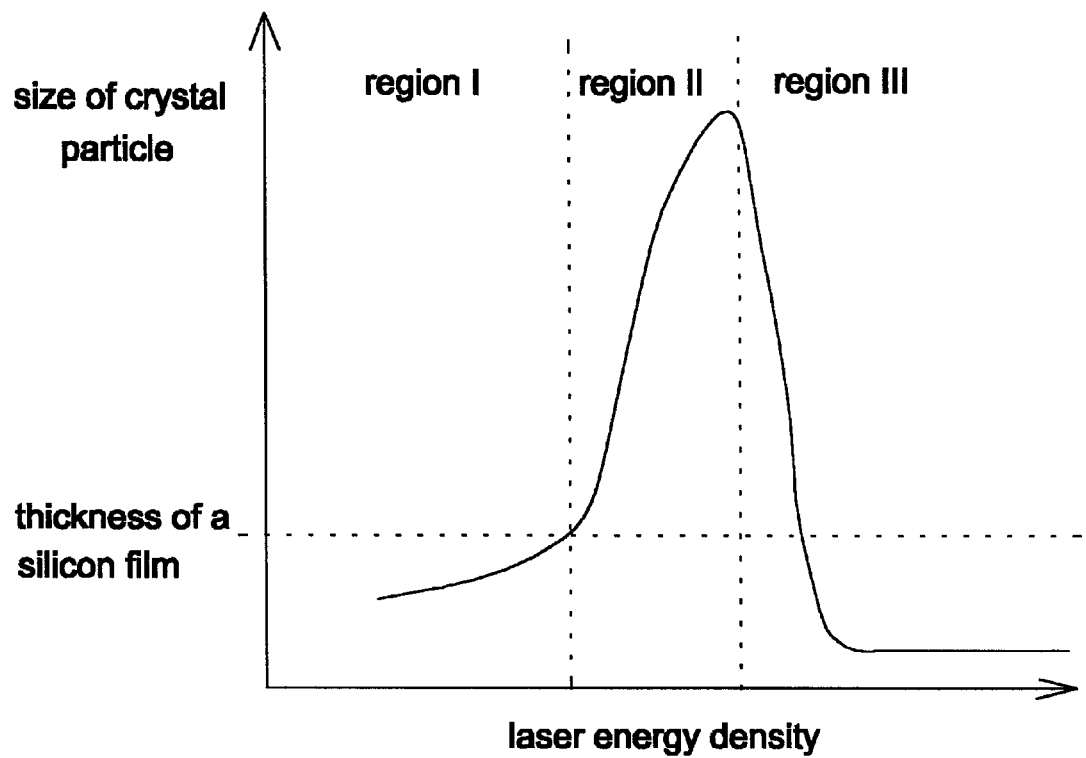
FIG. 1 shows a graph of laser energy density vs. size of crystal particle when an amorphous siliconfilm is irradiated with an excimer laser by a single shot.
Figure 2A:
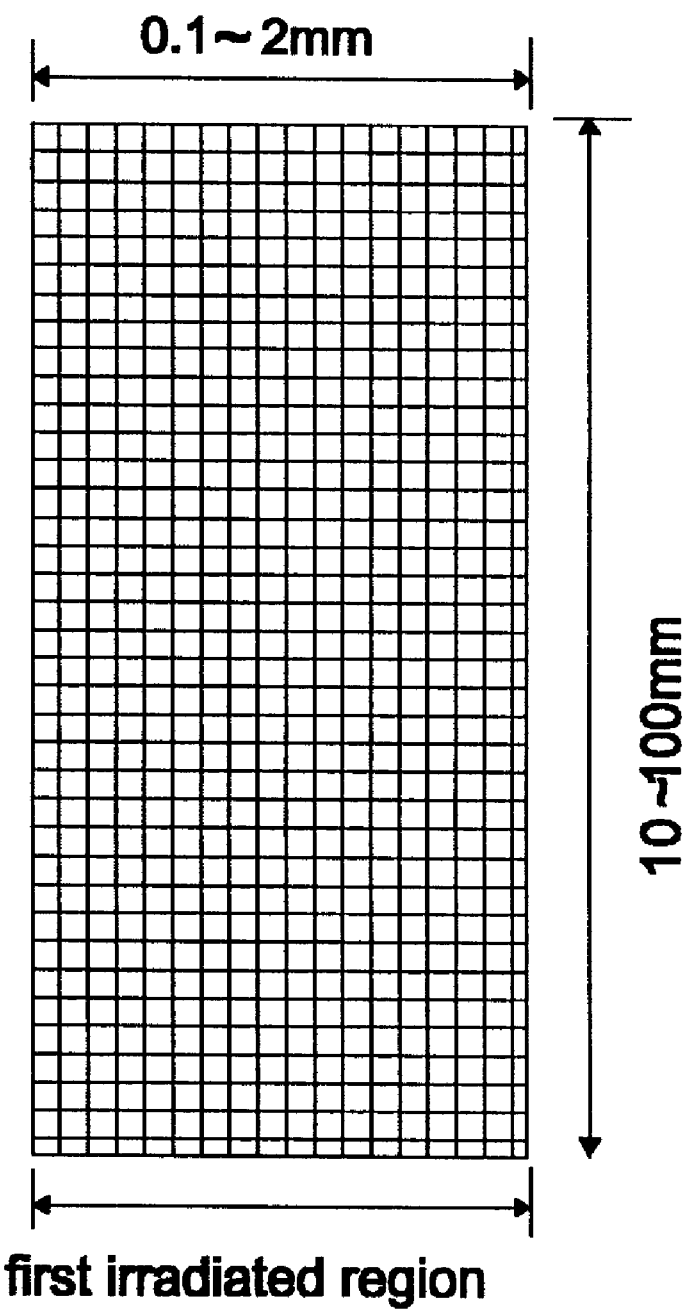
Figure 2B:
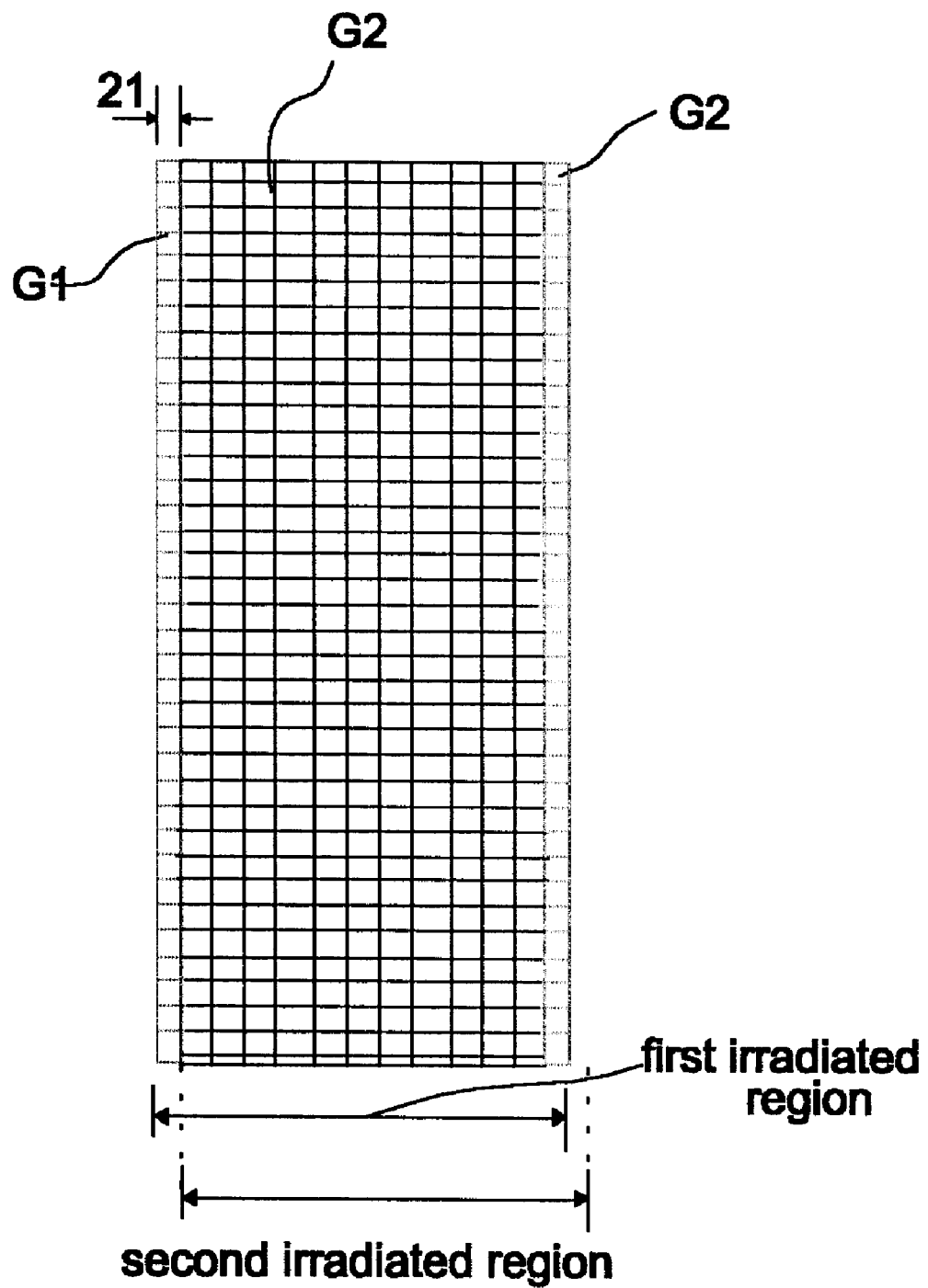

In the present invention, the width of the laser beam, which depends on the silicon film and laser energy density, is determined to be less than two times the length of a silicon grain grown by a single shot of the laser beam. The length of the lateral growth of a grain attained by a single shot of a laser beam varies according to the laser energy size and the state of an amorphous silicon film. The laser energy density is chosen sufficiently to melt the amorphous silicon film completely. For instance, the laser energy density of the present invention corresponds to region III in FIG. 1 of the related art. Accordingly, the process window of the present invention is wider than that of the related art.

Figure 3A:
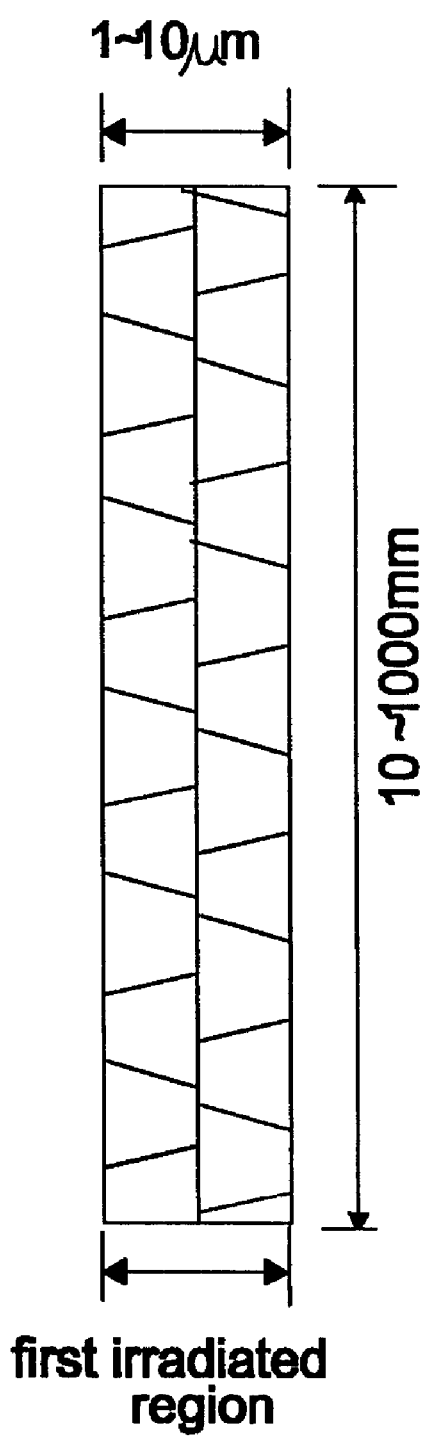
Figure 3C:
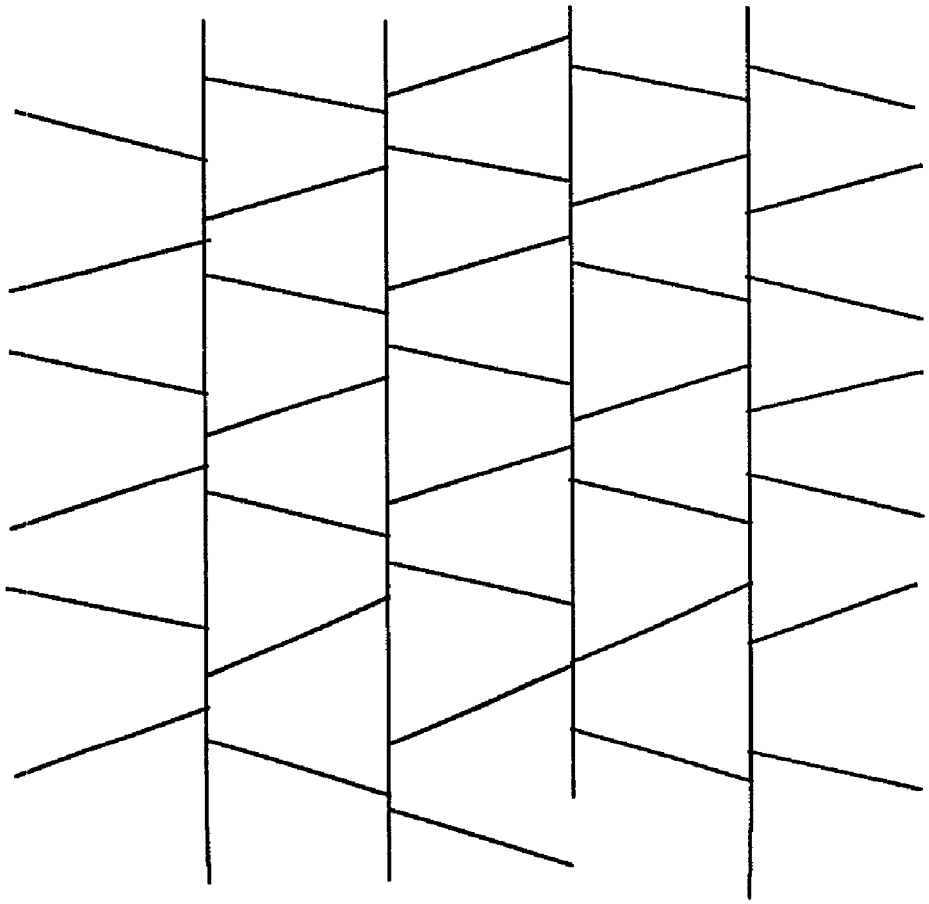

FIGS. 3A to 3C show schematic layouts of silicon crystallization by laser beam irradiation to explain laser annealing according to the present invention. A simplified figure of silicon is shown in the drawings.

Referring to FIG. 3A, a first irradiation is carried out on a silicon substrate with a laser beam adjusted by an optical system. As a result, a part of the silicon substrate exposed to the laser beam is melted down completely and then crystallized. In this case, grains proceed to grow laterally from an interface between an amorphous silicon region and a silicon melted region. Lateral growth of the grains takes place vertically to the interface. When (1) the silicon grains growing from both interfaces collide with one another at the center of the silicon melted region or (2) the silicon melted region is solidified enough to generate crystal nuclei to form polycrystalline silicon particles concurrently in a random fashion, the lateral growth stops according to the width of the silicon melted region.

Crystallization of the present invention proceeds such that the silicon grains having grown from both sides collide with one another, as shown in the drawing, since the width of the laser beam is made to be smaller than twice the length of the silicon grain grown by a single shot of the laser beam.

Referring to FIG. 3B, after being displaced by a predetermined distance, the silicon substrate undergoes a second irradiation with the laser beam. The displacement of the substrate is related to the degree of overlap of the laser beam. Thus, as the displacement of the substrate becomes longer, the degree of overlap becomes less. It is advantageous and preferable to have the overlap degree, which is set to be a minimum to reduce the number of laser beam irradiations, of the laser beam to be under half of the laser beam width.

In FIG. 3B, 31 designates a region irradiated by the laser beam repeatedly. The silicon part exposed to the second laser beam irradiation is melted down and crystallized. In this case, lateral growth of the grains proceed to grow laterally as the grains having grown by the first irradiation act as crystallizing seeds. Silicon grains also grow at the opposite side.

G4 denotes the silicon grains grown by the first laser beam irradiation, while G5 designates the silicon grains grown continuously by the second laser beam irradiation from the silicon grains irradiated by the first laser beam irradiation. G6 denotes the silicon grains grown by the second laser beam irradiation only.

Referring to FIG. 3C, the laser beam irradiation and crystallization are carried out repeatedly by scanning an entire surface of the substrate, thereby forming a polycrystalline silicon film consisting of large silicon grains. The silicon grains in the drawing were formed preferably by two laser beam irradiations on average. Considering that a silicon grain length formed by a single shot of a laser beam is about 2~4 micrometers, the silicon grain can be grown up to a maximum of 4~8 micrometers by the present invention with a width of the laser beam about 4~8 micrometers long.

In the first embodiment of the present invention, process time can be reduced since the overlap degree of the laser beam is greatly reduced. The crystallization process can be carried out with ease without being under vacuum since the number of laser beam irradiations is greatly reduced. Moreover, an optical system can be prepared easily owing to a wide process window since laser energy density is determined by the region where a silicon film is completely melted down. Such merits of the present invention improves productivity.

Figure 4:
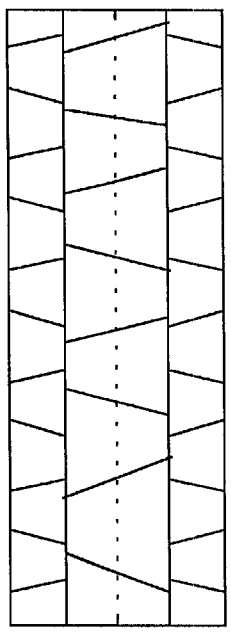
FIG. 4 shows schematic layouts of silicon crystallization by laser annealing according to a second embodiment of the present invention.
Figure 4:
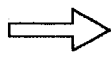
Figure 4:
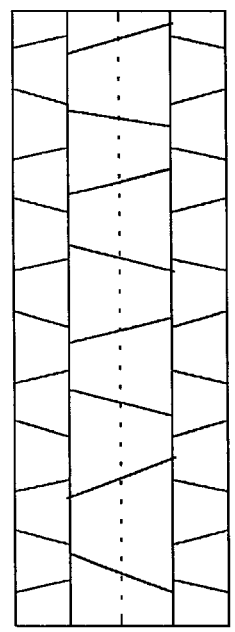
Figure 4:
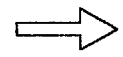

FIG. 4 shows schematic layouts of silicon crystallization by laser beam irradiation to explain laser annealing according to a second embodiment of the present invention. Simplified figures of silicon are shown in the drawings.

Referring to FIG. 4, the second embodiment of the present invention carries out laser annealing by the same or similar conditions of the first embodiment of the present invention, but crystallizes a silicon film by at least two laser beams in use of an optical system. The crystallization process of the second embodiment is as good as that of the first embodiment of the present invention, but differs in that silicon crystallization can occur frequently and simultaneously. In this case, the improvement of the processing speed depends on the number of the laser beams, and the processing speed is proportional to the number of the laser beams.

In FIG. 4, 41 denotes a silicon grain region crystallized by a first laser beam out of a plurality of laser beams, while 42 designates another silicon region crystallized by a second laser beam of a plurality of the laser beams.

Figure 5A:
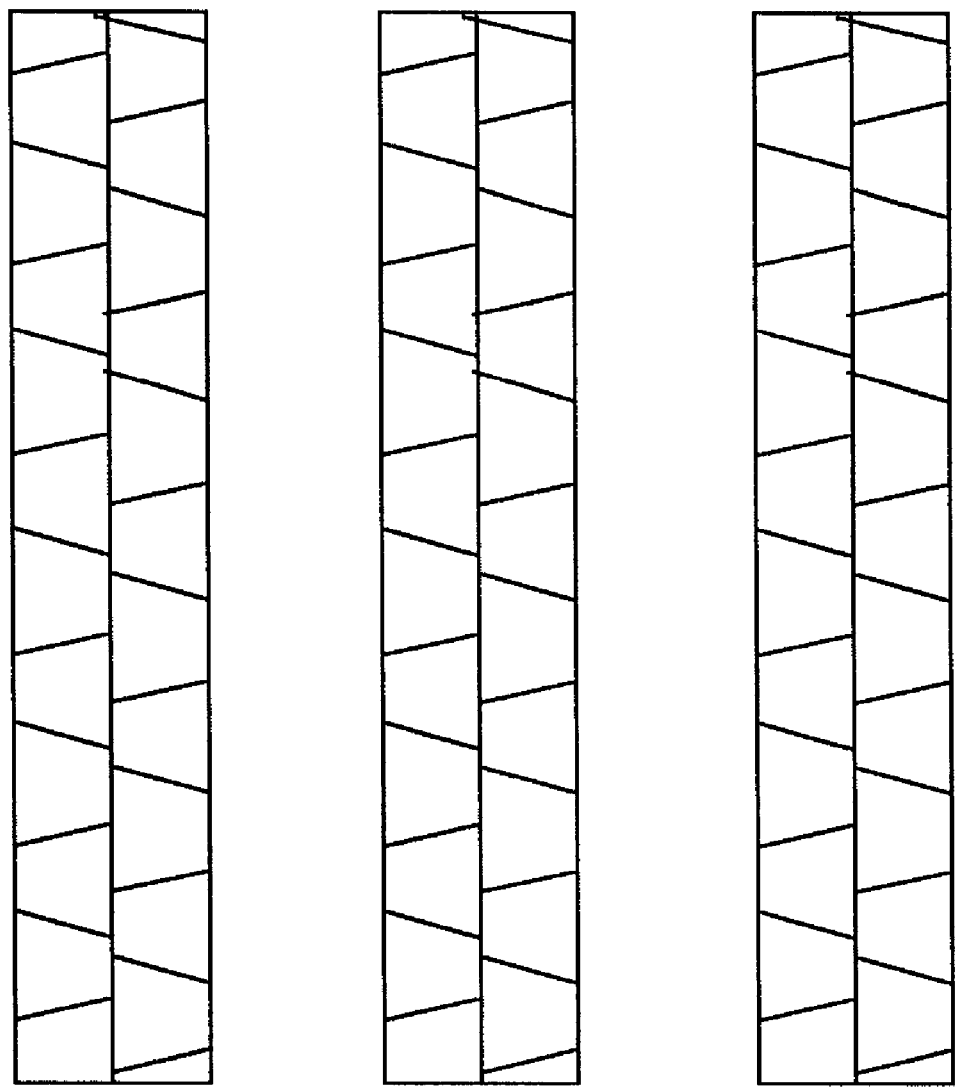
FIGS. 5A and 5B show schematic layouts of silicon crystallization by laser annealing in accordance with the number of laser beam irradiations according to a third embodiment of the present invention.
Figure 5A:
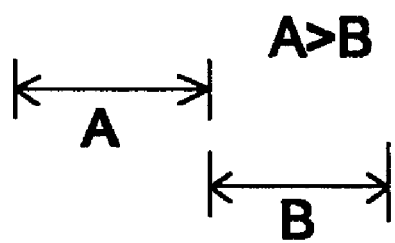
Figure 5B:
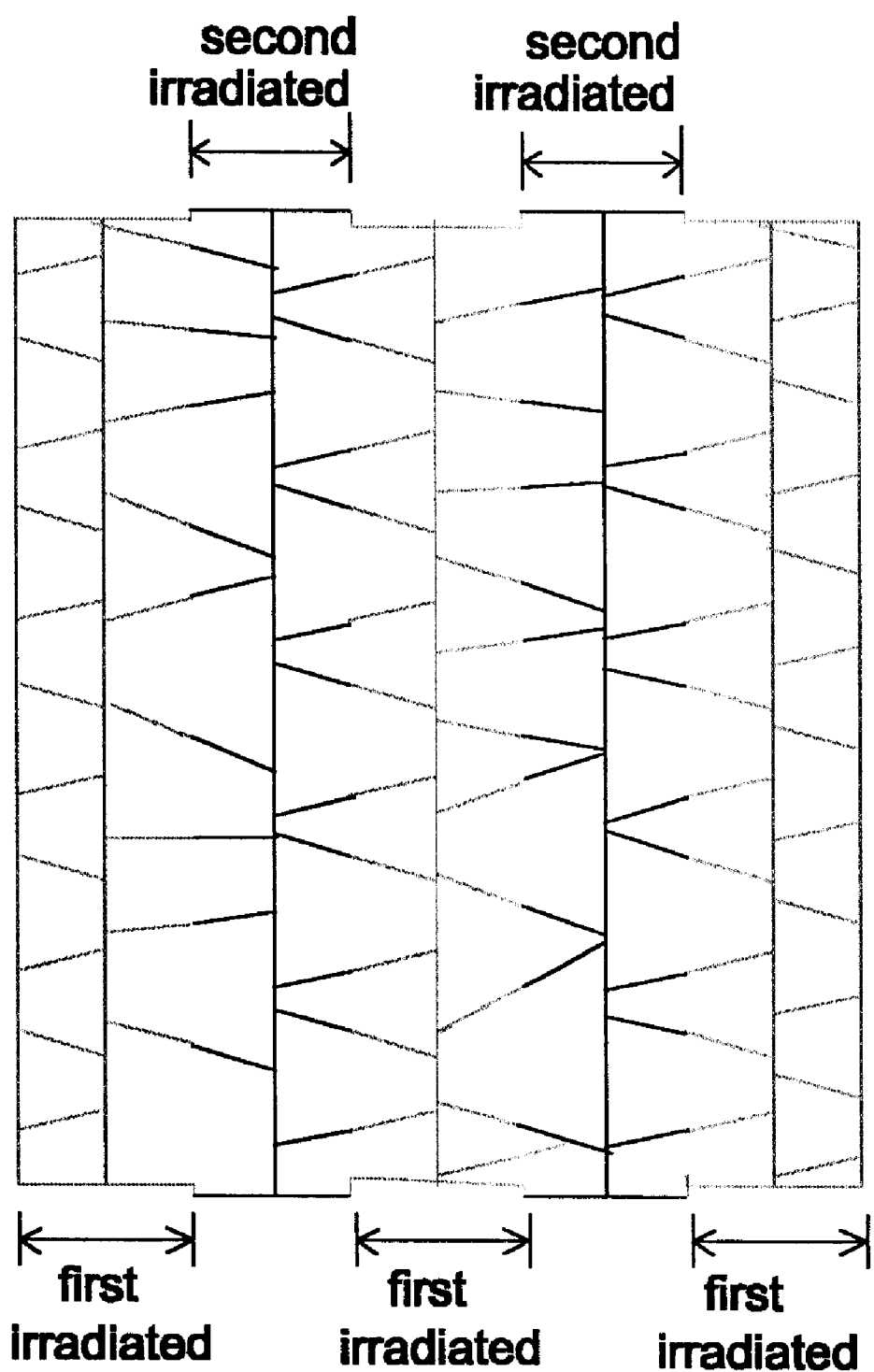

FIGS. 5A and 5B show schematic layouts of silicon crystallization by laser beam irradiation to explain laser annealing according to a third embodiment of the present invention. Simplified figures of silicon are shown in the drawings. In the third embodiment of the present invention, a plurality of laser beams were arranged and crystallization of a silicon film was achieved preferably by two laser beam irradiations. Here an interval B between the beams is shorter than a width A of the beam.

Referring to FIG. 5A, a plurality of laser beams each of which width such as about 2 $\mu$m, for example, are produced by an optical system. A substrate is irradiated with a plurality of the laser beams. In this case, an interval B, for instance about 1.9 $\mu$m, between the beams is shorter than a width A of the beam. The silicon film irradiated by the laser beams is crystallized by the same method as in the first embodiment as silicon grains grow from both ends.

Referring to FIG. 5B, after being displaced to a predetermined distance such as about 1.8~2.0 $\mu$m, the silicon substrate undergoes a second irradiation by the laser beams. A portion of silicon exposed to the second laser beam irradiation is completely melted down and then crystallized. In this case, the silicon grains having grown by the first laser beam irradiation continues to grow. The silicon crystallization proceeds from both sides in such a way that the silicon grains lying at both edges of the melted region act as crystallizing seeds.

As a result, the third embodiment of the present invention achieves laser crystallization of a predetermined region of a silicon film preferably by two laser beam irradiations.

The present invention decreases process time by reducing the degree of overlap of the laser beam and the number of laser beam irradiations. The present invention does not require a vacuum condition to prevent surface roughness due to multiple laser irraditions. The present invention, which selects the laser energy region sufficient for melting silicon completely, has easy process conditions owing to the wide process window. Moreover, the present invention forms large silicon grains with a relatively reduced number of laser beam irradiations, thereby producing a thin film transistor of excellent characteristics.

It will be apparent to those skilled in the art that various modifications and variations can be made in the laser annealing method of the present invention without departing from the spirit or scope of the inventions. Thus, it is intended that the present invention cover the modifications and variations of this invention provided they come within the scope of the appended claims and equivalents.

What is claimed is:

1. A method of annealing a silicon film having an interface with an underlying surface, comprising:
    growing a silicon grain having a length by completely melting a section of the silicon film to the interface using a first shot of a laser beam having a beam width that is greater than the length of the silicon grain, but less than twice the length of the silicon grain; and
    increasing the length of the grown silicon grain by completely remelting part of the grown silicon grain using a second shot of the laser beam, wherein the remelted part is determined by displacing the laser beam relative to the substrate more than one-half of the beam width of the laser beam.

2. The method of annealing a silicon film according to claim 1, wherein the silicon film is scanned by the laser beam.

3. The method of annealing a silicon film according to claim 2, wherein the silicon film is scanned by repeated steps of growing silicon grains, displacing the laser beam relative to the silicon film, remelting part of the grown silicon grains, and then again displacing the laser beam relative to the silicon film.

4. The method of annealing a silicon film according to claim 1, wherein the length of the silicon grain grown by the first shot of the laser beam is about 2 to 4 micrometers.

5. The method of annealing a silicon film according to claim 4, wherein the length of the silicon grain is increased to about 4 to 8 micrometers by the second shot of the laser beam.

6. The method of annealing a silicon film according to claim 1, wherein the silicon film is amorphous silicon before the first shot of the laser beam.

7. The method of annealing a silicon film according to claim 1, wherein the silicon grain is grown and lengthened at atmospheric pressure.

8. The method of annealing a silicon film according to claim 1, wherein the laser beam has a beam width less than 10 micrometers.

9. A method of annealing a silicon film having an interface with an underlying surface, comprising:

growing a silicon grain having a length by completely melting a section of the silicon film to the interface using a shot from a first laser that produces a laser beam having a beam width that is greater than the length of the silicon grain, but less than twice the length of the silicon grain; and increasing the length of the grown silicon grain by completely remelting part of the grown silicon grain using a shot from a second laser, wherein the remelted part is less than one-half of the beam width of the laser beam produced by the first laser.

10. The method of annealing a silicon film according to claim 9, wherein the silicon film is scanned by the first laser and by the second laser.

11. The method of annealing a silicon film according to claim 10, wherein scanning is performed by repeated steps of growing silicon grains, moving the silicon film relative to the second laser, remelting part of the grown silicon grain, and then again displacing the silicon film relative to the second laser.

12. The method of annealing a silicon film according to claim 9, wherein the length of the silicon grain grown by the shot from the first laser is about 2 to 4 micrometers.

13. The method of annealing a silicon film according to claim 12, wherein the length of the silicon grain is increased to about 4 to 8 micrometers by the second laser.

14. The method of annealing a silicon film according to claim 9, wherein the silicon film is amorphous silicon before the shot from the first laser.

15. The method of annealing a silicon film according to claim 9, wherein the silicon grain is grown and lengthened at atmospheric pressure.

16. A method of annealing a silicon film according to claim 9, wherein the second laser produces a laser beam having a beam width that is greater than the length of the silicon grain, but less than twice the length of the silicon grain.

17. A method of annealing a silicon film according to claim 16, wherein the first laser beam and the second laser beam are seperated by less than the beam width of the second laser beam.

18. A method a annealing a silicon film having an interface with an underlying surface, comprising:

growing a first silicon grain having a length by completely melting a first section of the silicon film to the interface using a first shot from a first laser that produces a first laser beam having a beam width that is greater than the length of the first silicon grain, but less than twice the length of the first silicon grain;

growing a second silicon grain having a length by completely melting a second section of the silicon film all the way to the interface using a shot from a second laser that produces a second laser beam having a beam width that is greater than the length of the second silicon grain, but less than twice the length of the second silicon grain, wherein the second section of the silicon film is displaced from the first section of the silicon film by a third section of the silicon film, wherein the third section has a span less than the beam width of the first laser beam; and increasing the length of the first silicon grain and the length of the second silicon grain by melting the third section of the silicon film using a second shot from the first laser, wherein part of the grown first silicon grain and part of the grown second silicon grain are re-melted.

19. The method of annealing a silicon film according to claim 18, wherein the silicon film is scanned by the first laser and by the second laser.

20. The method of annealing a silicon film according to claim 18, wherein the length of the grown first silicon grain is about 2 to 4 micrometers before the second shot from the first laser.

21. The method of annealing a silicon film according to claim 20, wherein the length of the grown first silicon grain is increased to about 4 to 8 micrometers after the second shot from the first laser.

22. The method of annealing a silicon film according to claim 18, wherein the silicon film is amorphous silicon before the first shot from the first laser.

23. The method of annealing a silicon film according to claim 22, wherein the first silicon grain is grown and lengthened at atmospheric pressure.

24. A method of annealing a silicon film according to claim 18, wherein the first laser beam and the second laser beam are separated by less than the beam width of the second laser beam.

* * * * *